US012750975B2

(12) United States Patent
Gonzalez et al.

(10) Patent No.: US 12,750,975 B2
(45) Date of Patent: Sep. 29, 2026

(54) PHASE CHANGE HEAT SINK TRANSPIRATION COOLING

(71) Applicant: Raytheon Company, Arlington, VA (US)

(72) Inventors: Nicholas Gonzalez, Vail, AZ (US); Adam C. Wood, Oro Valley, AZ (US)

(73) Assignee: Raytheon Company, Arlington, VA (US)

(*) Notice: Subject to any disclaimer, the term of this patent is extended or adjusted under 35 U.S.C. 154(b) by 192 days.

(21) Appl. No.: 18/598,893

(22) Filed: Mar. 7, 2024

(65) Prior Publication Data

US 2025/0287533 A1 Sep. 11, 2025

(51) Int. Cl.

*H05K 7/20* (2006.01)
*B64D 13/00* (2006.01)

(52) U.S. Cl.

CPC ....... *H05K 7/20327* (2013.01); *B64D 13/006* (2013.01); *H05K 7/20381* (2013.01)

(58) Field of Classification Search

CPC ........... H05K 7/20145; H05K 7/20236; H05K 7/20254; H05K 7/20272; H05K 7/20281; H05K 7/2029; H05K 7/20309; H05K 7/20327; B64D 13/006; B64D 2013/0614; B64D 2013/0622; B64D 2013/0674; B64C 21/08; B64C 2230/04; B64C 2230/06; B60H 1/00

See application file for complete search history.

(56) References Cited

U.S. PATENT DOCUMENTS

| | | | | |
|---|---|---|---|---|
| 4,819,720 A * | 4/1989 | Howard | B64D 13/00 165/104.34 |
| 8,251,312 B1 | 8/2012 | Daso et al. | |
| 2018/0216538 A1* | 8/2018 | Papa | B64D 15/04 |
| 2021/0102492 A1* | 4/2021 | Rambo | F02C 7/185 |
| 2022/0042747 A1* | 2/2022 | Bishop | B64D 13/006 |

(Continued)

FOREIGN PATENT DOCUMENTS

| | | |
|---|---|---|
| CN | 107914862 | 4/2018 |
| CN | 110127066 | 8/2019 |
| CN | 113972460 | 1/2022 |

OTHER PUBLICATIONS

"International Application Serial No. PCT US2025 018759, International Search Report mailed May 28, 2025", 4 pgs.

(Continued)

*Primary Examiner* — Amir A Jalali
(74) *Attorney, Agent, or Firm* — Schwegman Lundberg & Woessner, P.A.

(57) ABSTRACT

An apparatus and system are provided to provide transpiration cooling for an airframe. An airframe includes a body that contains circuitry, a phase change material (PCM) that changes phase to a gas when cooling the circuitry, a fluid reservoir that retains the PCM in liquid and gaseous form, a vapor reservoir that retains the gas, a thermal sensor that detects a temperature of an external surface of the body, and a controller that control ejection of the gas from the vapor reservoir based on the temperature to control a thickness of a boundary air layer at the external surface. The controller also controls flow of the gas from the fluid reservoir to the vapor reservoir via a valve based on pressure in the vapor reservoir detected by a pressure sensor.

20 Claims, 5 Drawing Sheets

(56) References Cited

U.S. PATENT DOCUMENTS

| | | | | |
|---|---|---|---|---|
| 2022/0063816 A1* | 3/2022 | Haruki | .................. | B64D 13/08 |
| 2022/0090866 A1* | 3/2022 | Haruki | .................. | F28D 15/06 |

OTHER PUBLICATIONS

"International Application Serial No. PCT US2025 018759, Written Opinion mailed May 28, 2025", 8 pgs.
"How do you help hypersonics keep their cool? Make them sweat", RTX researchers validate 'transpiration cooling' in a test for DARPA, (Oct. 16, 2023), 5 pgs.
Schweikert, Sven, et al., "Experimental Investigation on Velocity and Temperature Distributions of Turbulent Cross Flows over Transpiration Cooled C/C Wall Segments", 5TH European Conference for Aeronautics and Space Sciences (EUCASS), (2013), 12 pgs.

* cited by examiner

PHASE CHANGE HEAT SINK TRANSPIRATION COOLING

FIELD

The subject matter disclosed herein relates to structural cooling, and transpiration cooling of an airframe.

BACKGROUND

Stresses in high-speed systems are often driven by extreme heating due to aerothermal heating. A boundary layer of a thin layer of air forms as a system travels through the atmosphere. Aerothermal heating occurs when the system travels at high speeds and the system interacts with the boundary layer via convection. Methods of interacting the boundary layer continue to exhibit problems, such as sourcing the material used to provide cooling to the system.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
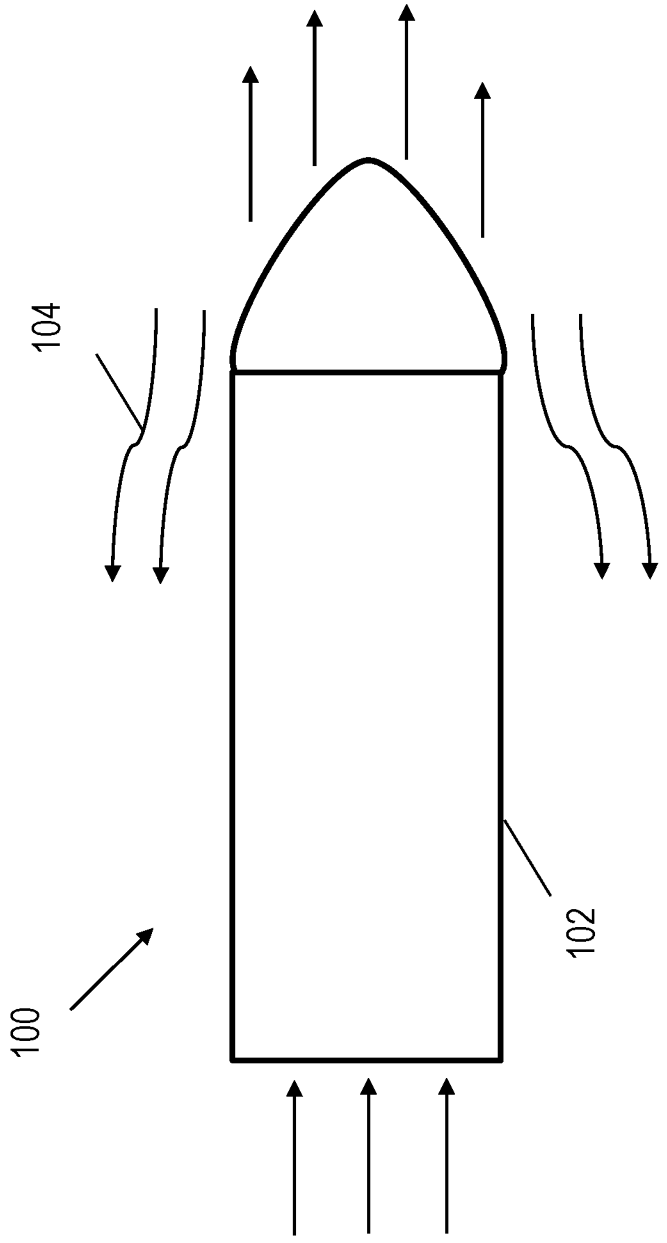
FIG. 1 illustrates an air vehicle.

FIG. 1 illustrates an air vehicle. The air vehicle 100 may contain an airframe 102 that generates flow 104 as it travels through the medium (in this case, air). The air vehicle 100 may be any object, such as an airplane or projectile. As the air vehicle 100 travels, a boundary layer forms. A boundary layer is a layer of essentially stationary fluid (such as in this case, air or water) adjacent to and surrounding an immersed object in relative motion with the fluid—i.e., the zone of flow in the immediate vicinity of the object in which the motion of the fluid is affected by the frictional resistance exerted by the boundary. A boundary layer may be either laminar (smooth) or turbulent (eddies), which creates more drag than a laminar boundary layer. The thickness of a boundary layer is defined as the distance from the body to the point at which the viscous flow velocity is 99% of the freestream velocity (the surface velocity of an inviscid flow). The thickness is determined by the relative magnitude of the slowing of fluid farther and farther away from the surface by the action of fluid friction and the sweeping of that lowmomentum fluid downstream and its replacement by fluid from upstream moving at the free-stream velocity.

As above, aerothermal heating occurs as the air vehicle 100 travels through the medium, which may become problematic at high speeds or accelerations due to rapid heating of at least some portions of the airframe 102. The length of time over which aerothermal heating occurs may vary dependent on the application and type of air vehicle 100. At high speeds or acceleration, for example, the aerothermal heating may occur over a matter of seconds. In such cases, transpiration cooling may be used to provide a layer of coolant to the airframe 102 to offset the boundary layer. However, several issues may be associated with transpiration cooling, including sourcing the fluid used for transpiration cooling. A reservoir may be used to store the fluid used for cooling, which may take up a substantial amount of free volume in a high-speed system where space is typically already limited and is at a premium.

In some embodiments, use of space may be reduced through the use of a Phase Change Material (PCM) heat sink to transpirationally cool a desired area on the airframe, while also using the PCM to passively cool electronics and other components within the airframe. The PCM heat sink transfers energy from a heat source to the sink (PCM material) itself, using energy storage inherent in the phase change to increase cooling capacity. While energy is transferred from the cooled component to the heat sink, the PCM heat sink may change from solid to liquid. However, some PCM heat sinks may further be able to phase change from liquid to gas, further allowing this liquid to gas transition to be used in such an arrangement. Other PCM material may initially start as a liquid or gel and transition to a gas when used to cool material.

Figure 2:
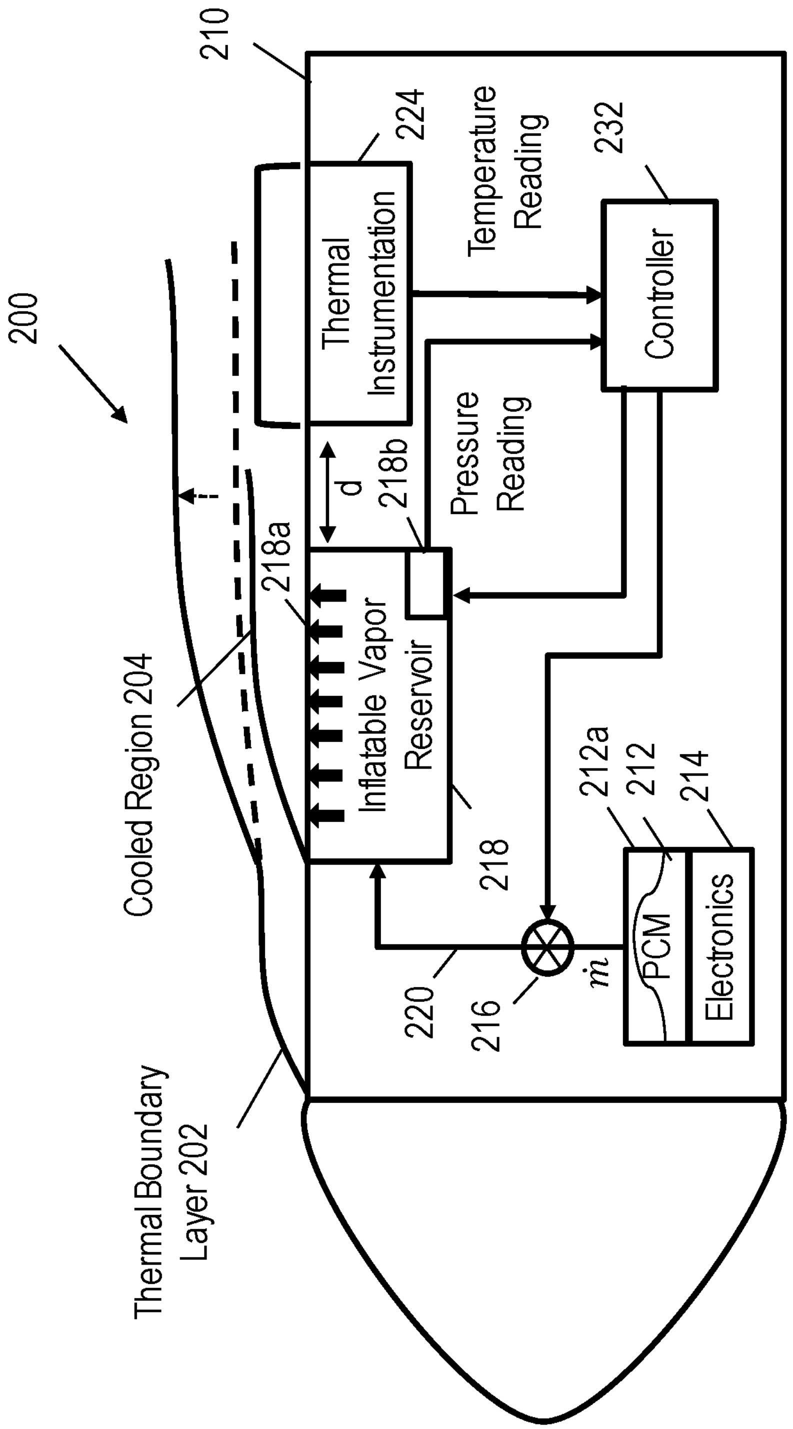
FIG. 2 illustrates a transpiration cooling system within the air vehicle.

FIG. 2 illustrates a transpiration cooling system within the air vehicle. As shown in FIG. 2, the air vehicle 200 may include a body 210 surrounded by a thermal boundary layer 202. Gaseous PCM heat sink material (gas) may be controllably ejected from the body 210 to thicken the thermal boundary layer 202 and create a cooled region 204 to transipirationally cool a portion of the body 210. The offset in the thermal boundary layer 202 is shown by the dotted line in FIG. 2. The air vehicle 200 may be a crewed or uncrewed vehicle (such as a jet or hypersonic aircraft) or a projectile, for example, the latter of which may suffer from problematic aerothermal heating during acceleration.

The gas may be supplied by a PCM 212 that is used to cool electronics 214 and/or other components disposed within the body 210. The PCM 212 may initially be a solid material that changes from solid to liquid and then from liquid to gas or may initially be a liquid material that changes from liquid or gel to gas. The liquid PCM 212 may be retained in a fluid reservoir **212*a*. The fluid reservoir 212*a* may thus retain a combination of solid, liquid, gel, and/or gas. After the PCM 212 evaporates into a gas, the gas may flow through a one-way valve 216 of a connector 220 into a vapor reservoir 218. The connector 220 may be, for example, a flexible duct or hose. The valve 216 stops material from backflowing into the fluid reservoir 212*a*. The PCM 212** may include methanol and/or water, for example.

In some embodiments, the vapor reservoir 218 may be inflatable to conserve space within the body 210 (conforming reservoir). The vapor reservoir 218 may be formed from a material that is capable of withstanding high temperatures (in excess of several hundred degrees Celsius). The vapor reservoir 218 may be mounted to an inner portion of the body 210 to ensure that the gas does not revert back into liquid phase. The vapor reservoir 218 may be pressure sealed allowing the pressure to increase related to the amount of gas inside of the vapor reservoir 218.

In response to a determination that cooling of the body 210 is to be performed, the gas inside the vapor reservoir 218 may be ejected controllably ejected through ports 218*a* in the vapor reservoir 218 for transpiration cooling. The ports 218*a* may be in any shape to provide the desired cooling at the desired location. The vapor reservoir 218 may extend in a continuous structure (such as a ring) around the circumference of the body 210 or multiple individual vapor reservoirs 218 may be used to provide cooling to all (or at least a majority) of the body 210 to be cooled. In some embodiments, multiple vapor reservoirs may be used along the length of the body 210 (in the direction d), dependent on the size and geometry of the body 210.

In some embodiments, a controller 232 may be used to control both the valve 216 and the ports 218*a*. The controller 232 may include a processor that receives information from various sensors within the body 210. In particular, thermal instrumentation 224, which may include a thermal sensor (such as a thermocouple or resistance temperature detector), may generate thermal information that is supplied to the controller 232. The thermal information may be disposed a distance d behind the vapor reservoir 218 in the direction of travel. The thermal information may include a temperature of the external portion of the body 210 where the thermal instrumentation 224 is located and/or an increase in temperature over a predetermined time period. The time period may be dependent on the type of sensor used, but may be, for example, on the order of ms to s. In response to the controller 232 determining that the temperature or rate of increase of temperature exceeding a predetermined threshold, the controller 232 may control the ports 218*a* in the vapor reservoir 218 to provide transpiration cooling to the area of the vapor reservoir 218, as well as the areas behind the vapor reservoir 218 in the direction of travel. In some embodiments, the controller 232 may include a proportional-integral-derivative (PID) controller and/or linear-quadratic regulator (LQR) controller, for example.

The vapor reservoir 218 may also contain a pressure sensor 218*b* at one or more locations therein. The pressure sensor 218*b* may provide pressure information of the vapor reservoir 218 to the controller 232. The controller 232 may use the pressure information of the vapor reservoir 218 to control the valve 216. That is, in response to the pressure information of the vapor reservoir 218 indicating that the pressure has reached a lower threshold, the controller 232 opens the valve 216 to permit gas (of the PCM 212) to flow from the fluid reservoir 212*a* to the vapor reservoir 218 through the connector 220. The controller 232 may use the pressure reading to ensure that the pressure is high enough to execute transpiration cooling. Similarly, in response to the pressure information of the vapor reservoir 218 indicating that the pressure has reached an upper threshold, the controller 232 closes the valve 216 to stop flow of the gas from the fluid reservoir 212*a* to the vapor reservoir 218. The various sensors may in addition or instead include non-contact instrumentation.

The upper and lower thresholds may be dependent on the amount of cooling desired as well as the structural limitations of the vapor reservoir 218. For example, the controller 232 may determine that a predetermined minimum amount of gas is to be retained in the vapor reservoir 218 to enable a predicted amount cooling (which may be based on size, shape, weight, acceleration, maximum velocity, etc. of the body 210). Due to the unpredictability associated with weather and fluid dynamics, the amount of cooling may vary from the predicted amount; thus, the predetermined minimum amount of gas may be somewhat larger than the maximum amount of cooling predicted. In addition, in response to the controller 232 determining from the pressure sensor 218*b* in the vapor reservoir 218 that the amount of gas has exceeded the predetermined maximum (e.g., may affect the integrity of the vapor reservoir 218), the controller 232 may open the ports 218*a* for a predetermined amount of time to bleed off some of the gas within the vapor reservoir 218 and reduce the pressure therein.

Additionally, one or more pressure (or other) sensors may be disposed in the fluid reservoir 212*a*. The controller 232 may be provided the information from these additional sensors to determine that the gas in the fluid reservoir 212*a* has reached an upper threshold and open the valve 216 to permit transfer of at least a portion of the gas from the fluid reservoir 212*a* to the vapor reservoir 218.

In some embodiments, the body 210 may include disparate sets of circuitry/electronics to cool. In this case, one or more PCM heat sinks may be used to cool the circuitry in each location, one or more of which may be used to fill one or more vapor reservoirs. The use of multiple gas sources may increase the total amount of cooling of the body 210, with control of the cooling and/or gas flow from the fluid reservoirs being controlled individually. In various embodiments, each fluid reservoir may be connected to the same single vapor reservoir through a single valve or through multiple valves (such as each valve corresponding to a different fluid reservoir), multiple fluid reservoirs may be connected to multiple vapor reservoirs (the number of fluid reservoirs may be the same for each vapor reservoir or may be different), or each fluid reservoir may be connected to a different vapor reservoir. If multiple liquid and/or vapor reservoirs are present, the size of the liquid or vapor reservoir may depend on the amount of circuitry to be cooled/PCMs used in the fluid reservoir or body area to be cooled by the vapor reservoir. Control of the valves and ports associated with each fluid reservoir and vapor reservoir may be independent.

The transpiration cooling described herein may permit the body 210 to be formed from materials that are able to survive at lower temperatures than if such cooling was not used. This permits use of lower cost (and lower mass) materials in construction of the body 210. The transpiration cooling system described may be used in some cases to allow the materials forming the body 210 to withstand very short term transient heating effects (on the order of up to a few s at most).

Figure 3:
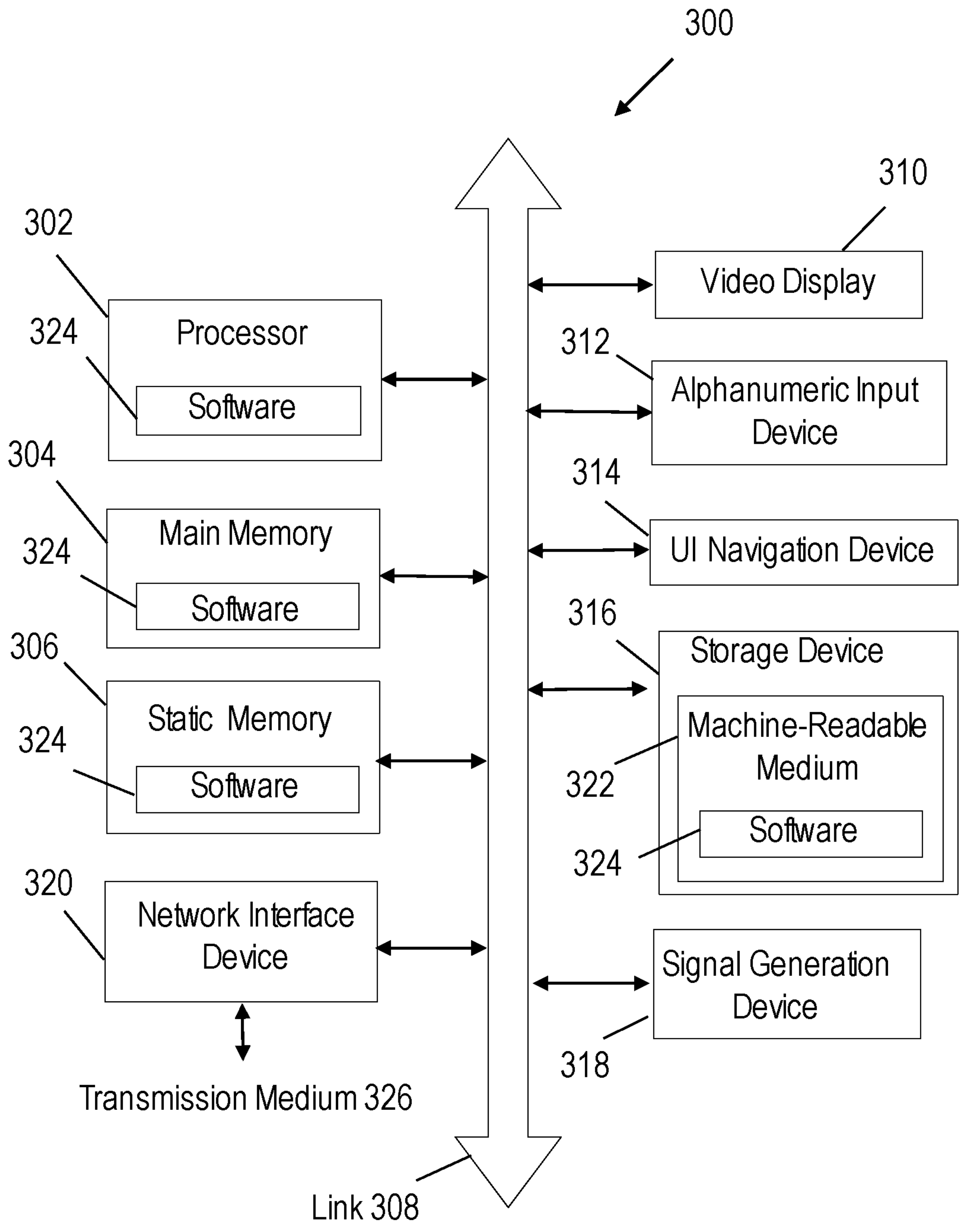
FIG. 3 illustrates a block diagram of a device in the air vehicle.

FIG. 3 illustrates a block diagram of an electronic device in accordance with some embodiments. The device 300 may be any electronic device (or circuitry) described herein. Examples of devices include specialized circuitry, a computer, a smart phone, or any machine capable of executing instructions (sequential or otherwise) that specify actions to be taken by that machine. For example, the electronics 214 and/or controller 232 shown in FIG. 2 may be incorporated in the device 300 (among other circuitry).

Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The device 300 may include some or all of the elements shown in FIG. 3, including a hardware processor (or equivalently processing circuitry) 302 (e.g., a central processing unit (CPU), a GPU, a hardware processor core, or any combination thereof), a main memory 304 and a static memory 306, some or all of which may communicate with each other via an interlink (e.g., bus) 308. The main memory 304 may contain any or all of removable storage and non-removable storage, volatile memory or non-volatile memory. The device 300 may further include a display unit 310 such as a video display, an alphanumeric input device 312 (e.g., a keyboard), and a user interface (UI) navigation device 314 (e.g., a mouse). In an example, the display unit 310, input device 312 and UI navigation device 314 may be a touch screen display. The device 300 may additionally include a storage device (e.g., drive unit) 316, a signal generation device 318 (e.g., a speaker), a network interface device 320, and one or more sensors, such as a global positioning system (GPS) sensor, compass, accelerometer, or another sensor. The device 300 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 316 may include a non-transitory machine readable medium 322 (hereinafter simply referred to as machine readable medium) on which is stored one or more sets of data structures or instructions 324 (e.g., software) embodying or utilized by any one or more of the techniques or functions described herein. The non-transitory machine readable medium 322 is a tangible medium. The instructions 324 may also reside, completely or at least partially, within the main memory 304, within static memory 306, and/or within the hardware processor 302 during execution thereof by the device 300. While the machine readable medium 322 is illustrated as a single medium, the term "machine readable medium" may include a single medium or multiple media (e.g., a centralized or distributed database, and/or associated caches and servers) configured to store the one or more instructions 324.

The term "machine readable medium" may include any medium that is capable of storing, encoding, or carrying instructions for execution by the device 300 and that cause the device 300 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 324 may further be transmitted or received over a communications network using a transmission medium 326 via the network interface device 320 utilizing any one of a number of wireless local area network (WLAN) transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as IEEE 802.11 family of standards known as Wi-Fi, IEEE 802.16 family of standards known as WiMax, IEEE 802.15.4 family of standards, an LTE family of standards, a UMTS family of standards, peer-to-peer (P2P) networks, a 5G standards among others. In an example, the network interface device 320 may include one or more physical jacks (e.g., Ethernet, coaxial, or phone jacks) or one or more antennas to connect to the transmission medium 326.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Any of the radio links described herein may operate according to any one or more of the following radio communication technologies and/or standards including but not limited to: a GSM radio communication technology, a GPRS radio communication technology, an Enhanced Data Rates for GSM Evolution (EDGE) radio communication technology, and/or a Third Generation Partnership Project (3GPP) radio communication technology, for example UMTS, Freedom of Multimedia Access (FOMA), 3GPP LTE, 3GPP Long Term Evolution Advanced (LTE Advanced), Code division multiple access 2000 (CDMA2000), Cellular Digital Packet Data (CDPD), Mobitex, Third Generation (3G), Circuit Switched Data (CSD), High-Speed Circuit-Switched Data (HSCSD), UMTS (3G), Wideband Code Division Multiple Access (UMTS) (W-CDMA (UMTS)), High Speed Packet Access (HSPA), High-Speed Downlink Packet Access (HSDPA), High-Speed Uplink Packet Access (HSUPA), High Speed Packet Access Plus (HSPA+), UMTS-Time-Division Duplex (UMTS-TDD), TD-CDMA, Time Division-Synchronous Code Division Multiple Access, 3rd Generation Partnership Project Release 8 (Pre-4th Generation) (3GPP Rel. 8 (Pre-4G)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17) and subsequent Releases (such as Rel. 18, Rel. 19, etc.), 3GPP 5G, 5G, 5G New Radio (5G NR), 3GPP 5G New Radio, 3GPP LTE Extra, LTE-Advanced Pro, LTE Licensed-Assisted Access (LAA), MuLTEfire, UMTS Terrestrial Radio Access (UTRA), E-UTRA, LTE Advanced (4G), cdmaOne (2G), Code division multiple access 3000 (Third generation) (CDMA2000 (3G)), Evolution-Data Optimized or Evolution-Data Only (EV-DO), Advanced Mobile Phone System (1st Generation) (AMPS (1G)), Total Access Communication System/Extended Total Access Communication System (TACS/ETACS), Digital AMPS (2nd Generation) (D-AMPS (2G)), PTT, Mobile Telephone System (MTS), Improved Mobile Telephone System (IMTS), Advanced Mobile Telephone System (AMTS), OLT (Norwegian for Offentlig Landmobil Telefoni, Public Land Mobile Telephony), MTD (Swedish abbreviation for Mobiltelefonisystem D, or Mobile telephony system D), Public Automated Land Mobile (Autotel/PALM), ARP (Finnish for Autoradiopuhelin, "car radio phone"), NMT (Nordic Mobile Telephony), High capacity version of NTT (Nippon Telegraph and Telephone) (Hicap), Cellular Digital Packet Data (CDPD), Mobitex, DataTAC, Integrated Digital Enhanced Network (iDEN), Personal Digital Cellular (PDC), Circuit Switched Data (CSD), Personal Handy-phone System (PHS), Wideband Integrated Digital Enhanced Network (WiDEN), iBurst, Unlicensed Mobile Access (UMA), also referred to as 3GPP Generic Access Network, or GAN standard), Zigbee, Bluetooth®, Wireless Gigabit Alliance (WiGig) standard, mmWave standards in general (wireless systems operating at 10-300 GHz and above such as WiGig, IEEE 802.11ad, IEEE 802.11ay, etc.), technologies operating above 300 GHz and THz bands, (3GPP/LTE based or IEEE 802.11p or IEEE 802.11bd and other) Vehicle-to-Vehicle (V2V) and Vehicle-to-X (V2X) and Vehicle-to-Infrastructure (V2I) and Infrastructure-to-Vehicle (I2V) communication technologies, 3GPP cellular V2X, Dedicated Short Range Communications (DSRC) communication systems such as Intelligent-Transport-Systems and others (typically operating in 5850 MHz to 5925 MHz or above (typically up to 5935 MHz following change proposals in CEPT Report 71)), the European ITS-G5 system (i.e. the European flavor of IEEE 802.11p based DSRC, including ITS-G5A (i.e., Operation of ITS-G5 in European ITS frequency bands dedicated to ITS for safety related applications in the frequency range 5,875 GHz to 5,905 GHz), ITS-G5B (i.e., Operation in European ITS frequency bands dedicated to ITS non-safety applications in the frequency range 5,855 GHz to 5,875 GHz), ITS-G5C (i.e., Operation of ITS applications in the frequency range 5,470 GHz to 5,725 GHz)), DSRC in Japan in the 700 MHz band (including 715 MHz to 725 MHz), IEEE 802.11bd based systems, etc.

Aspects described herein may be used in the context of any spectrum management scheme including dedicated licensed spectrum, unlicensed spectrum, license exempt spectrum, (licensed) shared spectrum (such as LSA=Licensed Shared Access in 2.3-2.4 GHz, 2.4-2.6 GHz, 2.6-2.8 GHz and further frequencies and SAS=Spectrum Access System/CBRS=Citizen Broadband Radio System in 3.55-3.7 GHz and further frequencies). Applicable spectrum bands include International Mobile Telecommunications spectrum as well as other types of spectrum/bands, such as bands with national allocation (including 450-470 MHz, 902-928 MHz (note: allocated for example in US (FCC Part 15)), 863-868.6 MHz (note: allocated for example in European Union (ETSI EN 300 320)), 915.9-929.7 MHz (note: allocated for example in Japan), 917-923.5 MHz (note: allocated for example in South Korea), 755-779 MHz and 779-787 MHz (note: allocated for example in China), 790-960 MHz, 1710-2025 MHz, 2110-2200 MHz, 2300-2400 MHz, 2.4-2.4835 GHz (note: it is an ISM band with global availability and it is used by Wi-Fi technology family (11b/g/n/ax) and also by Bluetooth), 2500-2690 MHz, 698-790 MHz, 610-790 MHz, 2400-2600 MHz, 2400-2800 MHz, 2800-4200 MHz, 2.55-2.7 GHz (note: allocated for example in the US for Citizen Broadband Radio Service), 5.15-5.25 GHz and 5.25-5.35 GHz and 5.47-5.725 GHz and 5.725-5.85 GHz bands (note: allocated for example in the US (FCC part 15), consists four U-NII bands in total 500 MHz spectrum), 5.725-5.875 GHz (note: allocated for example in EU (ETSI EN 201 893)), 5.47-5.65 GHz (note: allocated for example in South Korea, 5925-7125 MHz and 5925-6425 MHz band (note: under consideration in US and EU, respectively. Next generation Wi-Fi system is expected to include the 6 GHz spectrum as operating band. IMT-advanced spectrum, IMT-2020 spectrum, spectrum made available under FCC's "Spectrum Frontier" 5G initiative, the ITS band of 5.9 GHz (typically 5.85-5.925 GHz) and 63-64 GHz, bands currently allocated to WiGig such as WiGig Band 1 (57.24-59.40 GHz), WiGig Band (59.40-61.56 GHz) and WiGig Band 3 (61.56-63.72 GHz) and WiGig Band 4 (63.72-65.88 GHz), 57-64/66 GHz. In US (FCC part 15) allocates total 14 GHz spectrum, while EU (ETSI EN 202 567 and ETSI EN 201 217-2 for fixed P2P) allocates total 9 GHz spectrum), the 70.2 GHz-71 GHz band, any band between 65.88 GHz and 71 GHz, bands currently allocated to automotive radar applications such as 76-81 GHz, and future bands including 94-300 GHz and above. Furthermore, the scheme may be used on a secondary basis on bands such as the TV White Space bands (typically below 790 MHz) where in particular the 400 MHz and 700 MHz bands are promising candidates. Besides cellular applications, specific applications for vertical markets may be addressed such as Program Making and Special Events (PMSE), medical, health, surgery, automotive, low-latency, drones, etc. applications.

Figure 4:
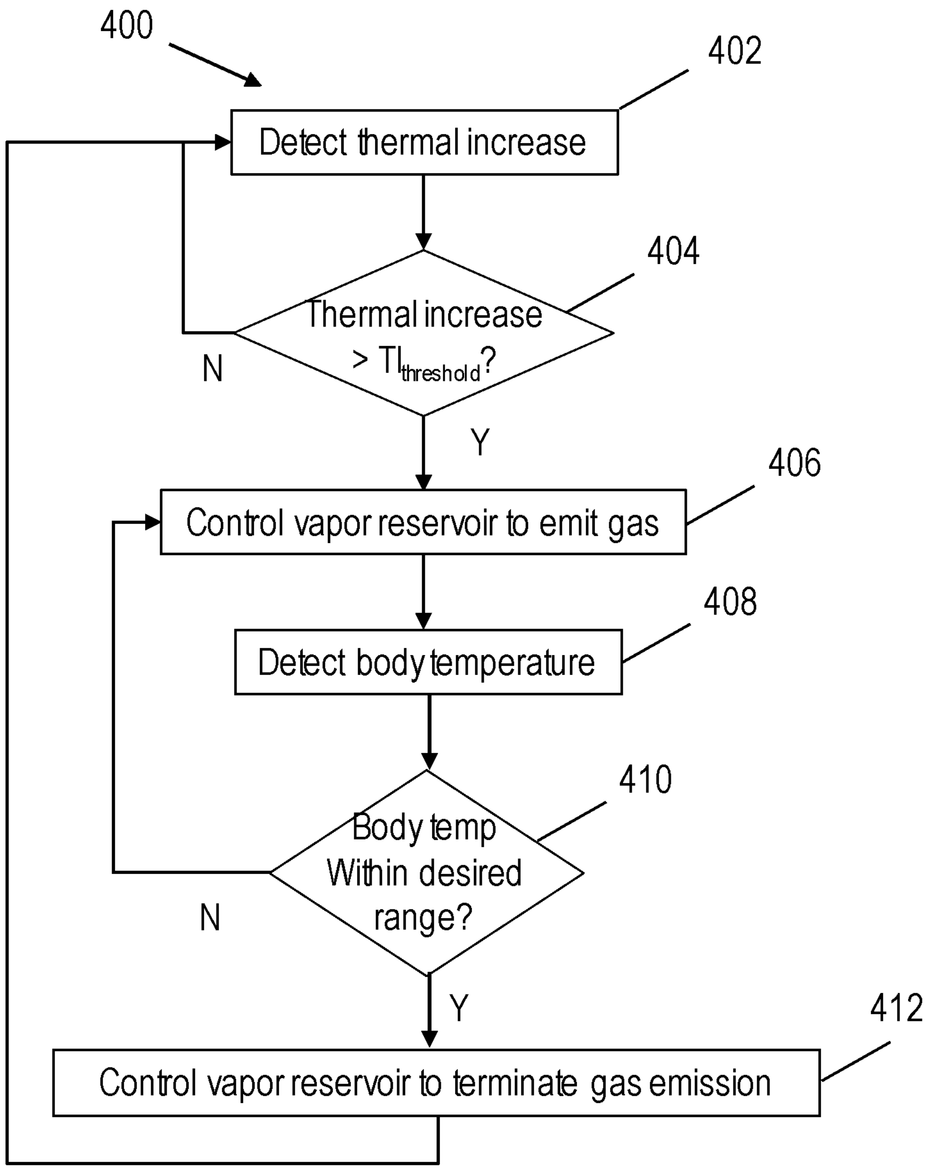
FIG. 4 illustrates a method of transpiration cooling the air vehicle.

FIG. 4 illustrates a method of transpiration cooling the air vehicle. The process 400 of FIG. 4 may be performed by the controller shown in FIG. 2. The process 400 is merely exemplary-additional operation may be present and/or some of the processes shown may be present. The process 400 may include detecting, at operation 402, a thermal increase at an area of an airframe. The thermal increase based on information may be provided from a thermal sensor and may be a rate of change or a temperature of the external portion of the airframe to be cooled.

At operation 404, the controller may determine whether the thermal increase exceeds a thermal threshold. In response to a determination that the thermal increase does not exceed the thermal threshold, the controller continues to determine at the next point in time (which may be essentially continuous) whether the thermal increase exceeds the thermal threshold. In some embodiments, operations 402 and 404 may be compressed into a single operation, where the thermal sensor may send a signal once the thermal threshold is exceeded and thus the mere reception of this signal acts as a determination that the thermal increase exceeds the thermal threshold.

In response to a determination that the thermal increase exceeds the thermal threshold, at operation 406 the controller may control the vapor reservoir to emit gas of a PCM stored therein through ports to increase the boundary layer at the area to be cooled (and thus cool this area). The internal pressure within the vapor reservoir may be sufficient to cause the gas to be ejected. Alternatively, the vapor reservoir may be physically manipulated to eject the gas. Here, as in FIG. 2, the controller may control the rate of gas ejection to control the amount of cooling. This rate of gas ejection (and thus rate of cooling) may be dependent on the temperature changes determined by the controller. In some embodiments, multiple thresholds may be set to allow the controller to determine the proper control of gas ejection. The controller may control the rate of gas ejection by controlling the size of the opening of each port through which the gas is ejected and/or the number of ports used to eject the gas.

At operation 408 a thermal sensor may detect whether the area of the body to be cooled has stabilized or been cooled after the release of the gas from the vapor reservoir. In some embodiments, the same thermal sensor disposed at the location of the vapor reservoir may be used may be used at operation 408. In other embodiments, a separate thermal instrument or sensor may be provided at one or more locations downstream of the vapor reservoir in addition to or instead of the thermal sensor disposed at the location of the vapor reservoir.

At operation 410, the thermal sensor may provide the body temperature to the controller, which may determine whether the body temperature is within a desired range or the rate of temperature increase has slowed to below a predetermined threshold. If not, the process 400 returns to operation 406, and the gas continues to be ejected. If so, the controller may control the vapor reservoir at operation 412 to terminate gas emission and the process 400 may return to operation 402.

Figure 5:
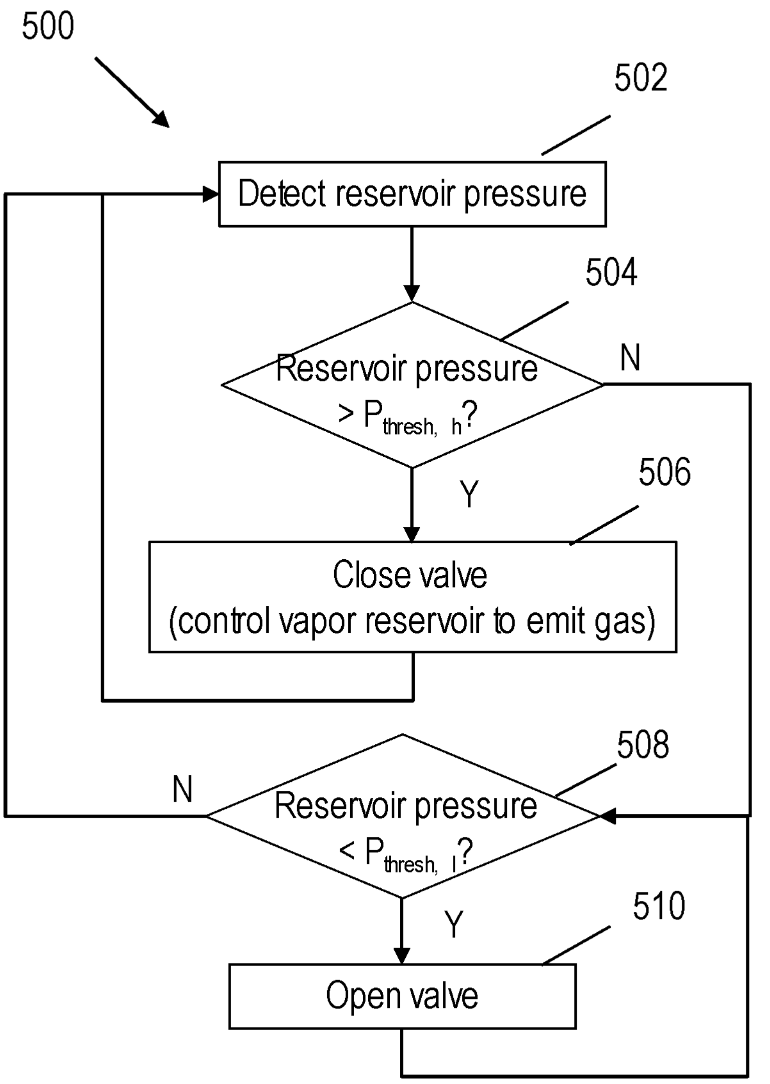
FIG. 5 illustrates a method of providing gas for transpiration cooling of the air vehicle.

FIG. 5 illustrates a method of providing gas for transpiration cooling of the air vehicle. The process 500 of FIG. 5 may be performed by the controller shown in FIG. 2. The process 500 is merely exemplary-additional operation may be present and/or some of the processes shown may be present. The process 500 may include detecting, at operation 502, a pressure in a fluid reservoir that stores liquid and gas of a PCM. The pressure may be detected by one or more pressure sensors within the fluid reservoir. In some embodiments, the valve used to control flow of the gas to the vapor reservoir may be initially open.

At operation 504, the controller may determine whether the pressure exceeds a high pressure threshold. In response to a determination that the pressure exceeds the high pressure threshold, at operation 506 the controller may control a one-way valve to close the valve and terminate flow of gas from the fluid reservoir to the vapor reservoir. The vapor reservoir may or may not be emitting gas at this point. The process 500 may then return to operation 502.

In response to a determination that the pressure does not exceed the high pressure threshold, at operation 508 the controller may determine whether the pressure is lower than a low pressure threshold. If not, the process 500 may return to operation 502.

In response to a determination that the pressure is lower than the low pressure threshold, at operation 510, the controller may control the one-way valve to open the valve and provide flow of gas from the fluid reservoir to the vapor reservoir. The vapor reservoir may or may not be emitting gas at this point. The process 500 may then return to operation 508.

Each of the processes shown in FIGS. 4 and 5 may be extended in a similar manner for multiple liquid and/or vapor reservoirs and valves described above. While FIGS. 4 and 5 are shown as separate diagrams, the processes of temperature detection and pressure detection may be conducted in parallel, with control of the transpiration cooling and valve occurring essentially simultaneously. Thus, for example, the controller may detect the temperature of the region to be cooled along with ensure that a minimum pressure is present within the vapor reservoir to permit transpiration cooling. As in FIGS. 4 and 5, this is a simplified description as additional operations may exist to ensure the detection and control by the controller.

EXAMPLES

Example 1 is a transpiration cooling system comprising a body that contains: electronics; a phase change material configured to change phase to a gas when cooling the electronics; a vapor reservoir configured to retain the gas; a connector coupled to the vapor reservoir to provide the gas to the vapor reservoir; a thermal sensor configured to detect a temperature of an external surface of the body; and a controller configured to: obtain temperature information from the thermal sensor, and based on the temperature information, control ejection of the gas from the vapor reservoir to control a thickness of a boundary air layer at the external surface.

In Example 2, the subject matter of Example 1 includes, a fluid reservoir configured to retain the phase change material in at least liquid and gaseous form, the connector coupled to the fluid reservoir.

In Example 3, the subject matter of Example 2 includes, a one-way control valve configured to control flow of the gas from the fluid reservoir to the vapor reservoir.

In Example 4, the subject matter of Example 3 includes, a pressure sensor configured to detect pressure in the vapor reservoir, the controller further configured to obtain pressure information from the pressure sensor and control the one-way control valve based on the pressure information.

In Example 5, the subject matter of Examples 1-4 includes, wherein the phase change material is configured to vaporize from a liquid and to the gas when cooling the electronics.

In Example 6, the subject matter of Examples 1-5 includes, wherein the vapor reservoir is an inflatable reservoir.

In Example 7, the subject matter of Examples 1-6 includes, wherein the thermal sensor is disposed a predetermined distance from the vapor reservoir, the thermal sensor being disposed behind the vapor reservoir in a direction of travel of the body.

In Example 8, the subject matter of Examples 1-7 includes, wherein the thermal sensor is configured to provide a temperature of the external surface as the temperature information.

In Example 9, the subject matter of Examples 1-8 includes, wherein the thermal sensor is configured to provide a rate of increase of temperature of the external surface as the temperature information.

In Example 10, the subject matter of Examples 1-9 includes, wherein the phase change material is configured to liquify to a liquid and then change to the gas when cooling the electronics.

Example 11 is an airframe comprising: a body configured to house at least: electronics; a phase change material configured to change phase to a gas when cooling the electronics; a vapor reservoir configured to retain the gas, the vapor reservoir having controllable openings to a first area of an external surface of the body; a surface sensor configured to detect a characteristic of a second area of the external surface of the body; and a controller configured to: obtain information from the surface sensor, and based on the information, control the openings to control ejection of the gas from the vapor reservoir to increase a thickness of a boundary air layer at the first area of the external surface and the second area of the external surface.

In Example 12, the subject matter of Example 11 includes, a fluid reservoir configured to retain the phase change material in at least liquid and gaseous form.

In Example 13, the subject matter of Example 12 includes, a connector that couples the fluid reservoir and the vapor reservoir to provide the gas to the vapor reservoir.

In Example 14, the subject matter of Example 13 includes, a one-way control valve configured to control flow of the gas from the fluid reservoir to the vapor reservoir.

In Example 15, the subject matter of Example 14 includes, a pressure sensor configured to detect pressure in the vapor reservoir, the vapor reservoir including an inflatable reservoir, the controller further configured to obtain pressure information from the pressure sensor and control the one-way control valve based on the pressure information.

In Example 16, the subject matter of Examples 11-15 includes, wherein the surface sensor includes a thermal sensor that is disposed a predetermined distance from the vapor reservoir, the thermal sensor being disposed behind the vapor reservoir in a direction of travel of the body.

In Example 17, the subject matter of Example 16 includes, wherein the thermal sensor is configured to provide a temperature of the external surface as the information.

Example 18 is a non-transitory computer-readable storage medium that stores instructions for execution by one or more processors of an air vehicle having a body that contains the one or more processors, the one or more processors to, when the instructions are executed: obtain pressure information of a vapor reservoir that contains a gas of a phase change material; control flow of the gas into the vapor reservoir from a fluid reservoir based on the pressure information, the fluid reservoir containing a liquid of a phase change material and the gas of the phase change material phase changed by cooling electronics; obtain temperature information from a thermal sensor configured to detect a temperature of an external surface of the body; determine that the temperature information indicates excessive heating of the external surface of the body; and based on the temperature information, control openings between the vapor reservoir and the external surface of the body to control ejection of the gas from the vapor reservoir to increase a thickness of a boundary air layer at the external surface.

In Example 19, the subject matter of Example 18 includes, wherein the one or more processors, when the instructions are executed, control flow of the gas into the vapor reservoir via control of a one-way control valve in a connector that couples the fluid reservoir and the vapor reservoir.

In Example 20, the subject matter of Examples 18-19 includes, wherein the thermal sensor is disposed a predetermined distance from the vapor reservoir, the thermal sensor being disposed behind the vapor reservoir in a direction of travel of the body.

Example 21 is at least one machine-readable medium including instructions that, when executed by processing electronics, cause the processing electronics to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to indicate one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. As indicated herein, although the term "a" is used herein, one or more of the associated elements may be used in different embodiments. For example, the term "a processor" configured to carry out specific operations includes both a single processor configured to carry out all of the operations as well as multiple processors individually configured to carry out some or all of the operations (which may overlap) such that the combination of processors carry out all of the operations. Further, the term "includes" may be considered to be interpreted as "includes at least" the elements that follow.

The Abstract of the Disclosure is submitted with the understanding that it will not be used to interpret or limit the scope or meaning of the claims. In addition, in the foregoing Detailed Description, it may be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A transpiration cooling system comprising a body that contains:
- electronics;
- a phase change material configured to change phase to a gas when cooling the electronics;
- a vapor reservoir configured to retain the gas;
- a connector coupled to the vapor reservoir to provide the gas to the vapor reservoir;
- a thermal sensor configured to detect a temperature of an external surface of the body; and
- a controller configured to:
  - obtain temperature information from the thermal sensor, and
  - based on the temperature information, control ejection of the gas from the vapor reservoir to control a thickness of a boundary air layer at the external surface.

2. The system of claim 1, further comprising a fluid reservoir configured to retain the phase change material in at least liquid and gaseous form, the connector coupled to the fluid reservoir.

3. The system of claim 2, further comprising a one-way control valve configured to control flow of the gas from the fluid reservoir to the vapor reservoir.

4. The system of claim 3, further comprising a pressure sensor configured to detect pressure in the vapor reservoir, the controller further configured to obtain pressure information from the pressure sensor and control the one-way control valve based on the pressure information.

5. The system of claim 4, wherein the phase change material is configured to vaporize from a liquid and to the gas when cooling the electronics.

6. The system of claim 5, wherein the vapor reservoir is an inflatable reservoir.

7. The system of claim 6, wherein the thermal sensor is disposed a predetermined distance from the vapor reservoir, the thermal sensor being disposed behind the vapor reservoir in a direction of travel of the body.

8. The system of claim 7, wherein the thermal sensor is configured to provide a temperature of the external surface as the temperature information.

9. The system of claim 8, wherein the thermal sensor is configured to provide a rate of increase of temperature of the external surface as the temperature information.

10. The system of claim 1, wherein the phase change material is configured to liquify to a liquid and then change to the gas when cooling the electronics.

11. An airframe comprising:
- a body configured to house at least:
  - electronics;
  - a phase change material configured to change phase to a gas when cooling the electronics;
  - a vapor reservoir configured to retain the gas, the vapor reservoir having controllable openings to a first area of an external surface of the body;
  - a surface sensor configured to detect a characteristic of a second area of the external surface of the body; and
  - a controller configured to:
    - obtain information from the surface sensor, and
    - based on the information, control the openings to control ejection of the gas from the vapor reservoir to increase a thickness of a boundary air layer at the first area of the external surface and the second area of the external surface.

12. The airframe of claim 11, further comprising a fluid reservoir configured to retain the phase change material in at least liquid and gaseous form.

13. The airframe of claim 12, further comprising a connector that couples the fluid reservoir and the vapor reservoir to provide the gas to the vapor reservoir.

14. The airframe of claim 13, further comprising a one-way control valve configured to control flow of the gas from the fluid reservoir to the vapor reservoir.

15. The airframe of claim 14, further comprising a pressure sensor configured to detect pressure in the vapor reservoir, the vapor reservoir including an inflatable reservoir, the controller further configured to obtain pressure information from the pressure sensor and control the one-way control valve based on the pressure information.

16. The airframe of claim 11, wherein the surface sensor includes a thermal sensor that is disposed a predetermined distance from the vapor reservoir, the thermal sensor being disposed behind the vapor reservoir in a direction of travel of the body.

17. The airframe of claim 16, wherein the thermal sensor is configured to provide a temperature of the external surface as the information.

18. A non-transitory computer-readable storage medium that stores instructions for execution by one or more processors of an air vehicle having a body that contains the one or more processors, the one or more processors to, when the instructions are executed:

obtain pressure information of a vapor reservoir that contains a gas of a phase change material;

control flow of the gas into the vapor reservoir from a fluid reservoir based on the pressure information, the fluid reservoir containing a liquid of a phase change material and the gas of the phase change material phase changed by cooling electronics;

obtain temperature information from a thermal sensor configured to detect a temperature of an external surface of the body;

determine that the temperature information indicates excessive heating of the external surface of the body; and based on the temperature information, control openings between the vapor reservoir and the external surface of the body to control ejection of the gas from the vapor reservoir to increase a thickness of a boundary air layer at the external surface.

19. The non-transitory computer-readable storage medium of claim 18, wherein the one or more processors, when the instructions are executed, control flow of the gas into the vapor reservoir via control of a one-way control valve in a connector that couples the fluid reservoir and the vapor reservoir.

20. The non-transitory computer-readable storage medium of claim 18, wherein the thermal sensor is disposed a predetermined distance from the vapor reservoir, the thermal sensor being disposed behind the vapor reservoir in a direction of travel of the body.

* * * * *